US009601470B2

(12) United States Patent
Okada

(10) Patent No.: US 9,601,470 B2
(45) Date of Patent: Mar. 21, 2017

(54) STACKED SEMICONDUCTOR DEVICE, PRINTED CIRCUIT BOARD, AND METHOD FOR MANUFACTURING STACKED SEMICONDUCTOR DEVICE

(71) Applicant: CANON KABUSHIKI KAISHA, Tokyo (JP)

(72) Inventor: Yuya Okada, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 324 days.

(21) Appl. No.: 14/308,838

(22) Filed: Jun. 19, 2014

(65) Prior Publication Data

US 2015/0003029 A1  Jan. 1, 2015

(30) Foreign Application Priority Data

Jun. 28, 2013  (JP) ................. 2013-137014

(51) Int. Cl.
*H05K 1/16* (2006.01)
*H01L 25/10* (2006.01)
(Continued)

(52) U.S. Cl.
CPC .......... *H01L 25/105* (2013.01); *H01L 21/565* (2013.01); *H01L 23/3128* (2013.01); *H01L 24/73* (2013.01); *H01L 24/83* (2013.01); *H01L 24/97* (2013.01); *H01L 2224/0401* (2013.01); *H01L 2224/04042* (2013.01);
(Continued)

(58) Field of Classification Search
CPC ....... H01L 25/117; H01L 21/56; H01L 23/28; H01L 31/0203; H01L 31/048; H01L 33/52; H01L 31/0481; H01L 23/293; H05K 3/284; H05K 1/144; H05K 2201/04; H05K 2201/042
USPC ........ 361/764, 765, 783, 784, 790; 257/678, 257/686, 787, 788, 793; 174/521
See application file for complete search history.

(56) References Cited

U.S. PATENT DOCUMENTS 8,836,102 B2 * 9/2014 Okada ..................... H01L 25/04
257/686
2008/0023814 A1 * 1/2008 Yang ..................... H01L 25/105
257/686
(Continued)

FOREIGN PATENT DOCUMENTS

JP          4800625      10/2011
WO   WO 2004/027823     4/2004

*Primary Examiner* — Binh Tran
(74) *Attorney, Agent, or Firm* — Fitzpatrick, Cella, Harper & Scinto

(57) ABSTRACT

A stacked semiconductor device includes a first semiconductor package and a second semiconductor package stacked thereon, and further includes a plate member interposed between the first semiconductor package and the second semiconductor package. The plate member has a plate body, protruding strips protruding toward its edges from the plate body, and leg portions respectively provided on the protruding strips. Each of the leg portions is disposed on a surface, which opposes one surface of a wiring substrate, of the protruding strip, and contacts the one surface of the wiring substrate. Thus, defective connection of connecting terminals due to warping of the wiring substrate and loading inclination of the first semiconductor package is reduced, resulting in an improved yield.

8 Claims, 7 Drawing Sheets

(51) Int. Cl.

| | | |
|---|---|---|
| H05K 1/18 | (2006.01) | |
| H05K 7/00 | (2006.01) | |
| H05K 1/11 | (2006.01) | |
| H05K 1/14 | (2006.01) | |
| H01L 23/00 | (2006.01) | |
| H01L 23/31 | (2006.01) | |
| H01L 21/56 | (2006.01) | |

(52) U.S. Cl.
CPC ............ *H01L 2224/05553* (2013.01); *H01L 2224/06135* (2013.01); *H01L 2224/131* (2013.01); *H01L 2224/13144* (2013.01); *H01L 2224/13147* (2013.01); *H01L 2224/16225* (2013.01); *H01L 2224/2929* (2013.01); *H01L 2224/29386* (2013.01); *H01L 2224/32225* (2013.01); *H01L 2224/45139* (2013.01); *H01L 2224/45147* (2013.01); *H01L 2224/48227* (2013.01); *H01L 2224/49175* (2013.01); *H01L 2224/73204* (2013.01); *H01L 2224/73253* (2013.01); *H01L 2224/73265* (2013.01); *H01L 2224/83862* (2013.01); *H01L 2224/97* (2013.01); *H01L 2225/1023* (2013.01); *H01L 2225/1052* (2013.01); *H01L 2924/15311* (2013.01); *H01L 2924/19107* (2013.01); *H01L 2924/3511* (2013.01)

(56) References Cited

U.S. PATENT DOCUMENTS

2010/0155920 A1* 6/2010 Lee ................... H01L 25/105
 257/686
2014/0070411 A1 3/2014 Okada ...................... 257/737

\* cited by examiner

STACKED SEMICONDUCTOR DEVICE, PRINTED CIRCUIT BOARD, AND METHOD FOR MANUFACTURING STACKED SEMICONDUCTOR DEVICE

BACKGROUND OF THE INVENTION

Field of the Invention

The present invention relates to a stacked semiconductor device in which a first semiconductor package and a second semiconductor package are stacked, a printed circuit board including the stacked semiconductor device, and a method for manufacturing the stacked semiconductor device.

Description of the Related Art

As an electronic device such as a portable information device, a digital still camera, or a digital video camera has been miniaturized and made highly functional, and a semiconductor device has been required to be densified and miniaturized. To respond to these requests, a stacked semiconductor device has been developed.

The stacked semiconductor device includes a multi-chip package (MCP) type stacked semiconductor device in which a plurality of semiconductor elements is stacked. However, a performance test is difficult to perform for a single semiconductor element. Thus, it cannot be found out whether the plurality of semiconductor elements operates until the MCP type stacked semiconductor device is completed. Therefore, the final yield of the MCP type stacked semiconductor device significantly decreases because it is the product of the respective efficiency percentages of the semiconductor elements. The larger the number of semiconductor elements to be stacked is, the more the yield decreases.

On the other hand, the semiconductor elements are easily subjected to a performance test if respectively contained in divided semiconductor packages. To manufacture the stacked semiconductor device with a high yield, therefore, the semiconductor packages, which have already been subjected to the performance test and have been guaranteed to be nondefective, are desirably stacked.

A Package in Package (PiP) type stacked semiconductor device has been developed (Japanese Patent No. 4800625). When a stacked semiconductor device of this type is manufactured, a plurality of first semiconductor packages is supplied to manufacturing processes in a sheet form of a semifinished product in which wiring substrates in the first semiconductor packages are connected to one another. Second semiconductor packages in a divided form are respectively stacked on the first semiconductor packages in the sheet form. Then, a conductor pad on the wiring substrate in the first semiconductor package and a conductor pad on the wiring substrate in the second semiconductor package are connected to each other through a metal wiring. Then, the second semiconductor package and the metal wiring, together with a semiconductor element in the first semiconductor package, are encapsulated with a resin. Then, after a connecting terminal composed of a solder is formed on the connecting conductor pad on the wiring substrate in the first semiconductor package, the wiring substrate in the first semiconductor package and an encapsulating resin are cut and divided into stacked semiconductor devices.

The PiP type stacked semiconductor device discussed in Japanese Patent No. 4800625 can use divided semiconductor packages that have already been tested as the second semiconductor packages. Therefore, the stacked semiconductor device can be manufactured with a higher yield than the MCP type stacked semiconductor device.

The plurality of first semiconductor packages is supplied to the manufacturing processes in the sheet form of the semifinished product in which the wiring substrates in the first semiconductor packages are connected to one another to collectively and efficiently manufacture a plurality of stacked semiconductor devices in a wire bonding process, a resin encapsulating process, and a connecting terminal forming process.

However, the first semiconductor packages in the sheet form are in a semifinished product state where the wiring substrates are connected to one another, unlike the divided semiconductor packages. Thus, the first semiconductor packages cannot be handled while having been subjected to a performance test and having been guaranteed to be nondefective, unlike the divided semiconductor packages.

In a method for manufacturing the PiP type stacked semiconductor device, to also use the divided semiconductor packages that have already been tested and have been guaranteed to be nondefective as the first semiconductor packages, a plate material in a sheet form in which a plurality of plate members are connected to one another may be used. If divided second semiconductor packages and the divided first semiconductor packages are respectively fixedly bonded to respective upper surfaces and lower surfaces of the plate members, the plurality of divided semiconductor packages can be supplied as one sheet form to the manufacturing processes through the plate material in the sheet form.

If the plurality of divided semiconductor packages is thus supplied as one sheet form to the manufacturing processes using the plate material in the sheet form, the plurality of stacked semiconductor devices can be collectively and efficiently manufactured, similarly to the conventional PiP type stacked semiconductor device. If the plurality of divided semiconductor packages is manufactured as one sheet form, the PiP type stacked semiconductor device can be manufactured with a higher yield and with productivity remaining high using the divided semiconductor packages, which have been guaranteed to be nondefective, as all the semiconductor packages to be used.

However, the wiring substrate in the semiconductor package is composed of a glass epoxy resin (13 to 40 [ppm]) or a copper foil used for wiring (15 to 20 [ppm]) having a higher linear expansion coefficient than that of the semiconductor element in the semiconductor package. Loading of the semiconductor element is followed by heating at a temperature of approximately 150 [° C.]. Thus, each of the divided semiconductor packages has a shape in which edges (particularly, corners) of the wiring substrate are warped toward the opposite side to a loading surface (one surface) of the semiconductor element at an ordinary temperature due to a difference between the linear expansion coefficients of the wiring substrate and the semiconductor element.

When the plurality of first semiconductor packages is fixedly bonded to the plate material in the sheet form, therefore, each of the first semiconductor packages is loaded while being inclined due to a warped shape of the first semiconductor package and the accuracy of a device on which the first semiconductor package is to be loaded. Thus, loading positions in a height direction of the plurality of first semiconductor packages vary. Further, the loading position in the height direction of each of the first semiconductor packages themselves varies due to a variation in thickness (±50 [µm]) of the first semiconductor package and the accuracy of the device on which the semiconductor package is to be loaded.

Further, if resin encapsulation is performed while the loading positions in the height direction of the plurality of first semiconductor packages loaded on the plate material in the sheet form varies, a gap occurs between a metal mold for resin encapsulation and a rear surface, on the opposite side to the loading surface of the semiconductor element, of the wiring substrate in each of the first semiconductor packages. When there is a gap between the metal mold for resin encapsulation and the rear surface of the wiring substrate in the first semiconductor package, an encapsulating resin enters the gap during the resin encapsulation.

When each of the semiconductor packages is heated, thermal deformation occurs due to the difference between the linear expansion coefficients of the wiring substrate and the semiconductor element. When the semiconductor package is resin-encapsulated, the semiconductor package is heated at a temperature of approximately 170 [° C.], which is higher than a heating temperature of 150 [° C.] when the semiconductor element is loaded on the wiring substrate. Therefore, edges of the wiring substrate in the first semiconductor package, which has been loaded on the plate material in the sheet form, are warped toward the loading surface of the semiconductor element due to the thermal deformation.

When the edges of the wiring substrate in each of the plurality of first semiconductor packages loaded on the plate material in the sheet form are thus warped toward the loading surface, a gap occurs between the metal mold for resin encapsulation and the rear surface of the wiring substrate in the first semiconductor package. If there is a gap between the metal mold for resin encapsulation and the rear surfaces of the wiring substrate in the first semiconductor package, the encapsulating resin enters the gap during the resin encapsulation.

When the encapsulating resin wraps around the rear surface of the first semiconductor package, a resin burr is generated on the rear surface of the wiring substrate in the first semiconductor package. When the resin burr is generated on the rear surface of the wiring substrate in the first semiconductor package, a connecting conductor pad disposed on the rear surface of the wiring substrate in the first semiconductor package is covered with the resin burr. Thus, a connecting terminal such as a solder ball cannot be formed, resulting in defective connection. If the divided first semiconductor packages and the divided second semiconductor packages are thus fixedly bonded to the plate members to manufacture the PiP type stacked semiconductor device, the yield of the PiP type stacked semiconductor device decreases due to the resin burr.

The present invention is directed to providing a stacked semiconductor device having a high yield, a printed circuit board, and a method for manufacturing the stacked semiconductor device.

SUMMARY OF THE INVENTION

According to an aspect of the present invention, a stacked semiconductor device comprises: a first semiconductor package having a first semiconductor element, and a first wiring substrate having a pair of surfaces, on one of which the first semiconductor element is mounted, and the other of which a plurality of connecting conductor pads each connected to a connecting terminal are formed, wherein a plurality of first conductor pads are formed on one or the other surface of the wiring substrate; a second semiconductor package being disposed at a side in opposition to the one surface of the first wiring substrate of the first semiconductor package, and having a second semiconductor element, and a second wiring substrate having a pair of surfaces, on one of which the second semiconductor element is mounted, wherein a plurality of second conductor pads are formed on one or the other surface of the wiring substrate; a plate member having a plate body arranged between the first and second semiconductor packages, and fixed to the first and second semiconductor packages, and a plurality of protruding strips protruding from a base end at the plate body to a position in opposition to an edge of the first wiring substrate; a plurality of metal wirings each for connecting electrically each of the first conductor pads to each of the second conductor pads; and a encapsulating resin for encapsulating at least the plurality of first conductor pads, the plurality of second conductor pads and the plurality of metal wirings, wherein the plate member has a plurality of leg portions contacting the one surface of the first wiring substrate.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Exemplary Embodiment)

Figure 1:
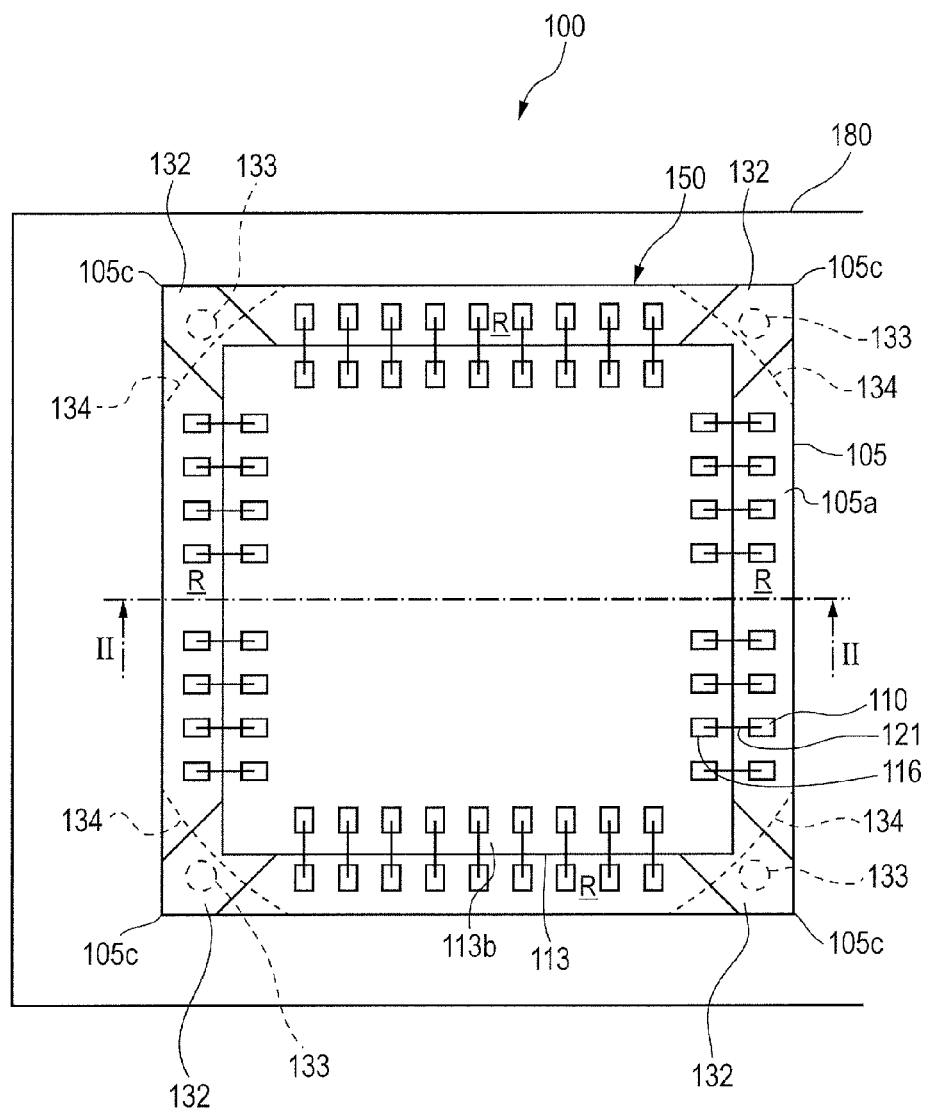
FIG. 1 is a plan view illustrating a schematic configuration of a printed circuit board including a stacked semiconductor device according to a first exemplary embodiment.
Figure 2:
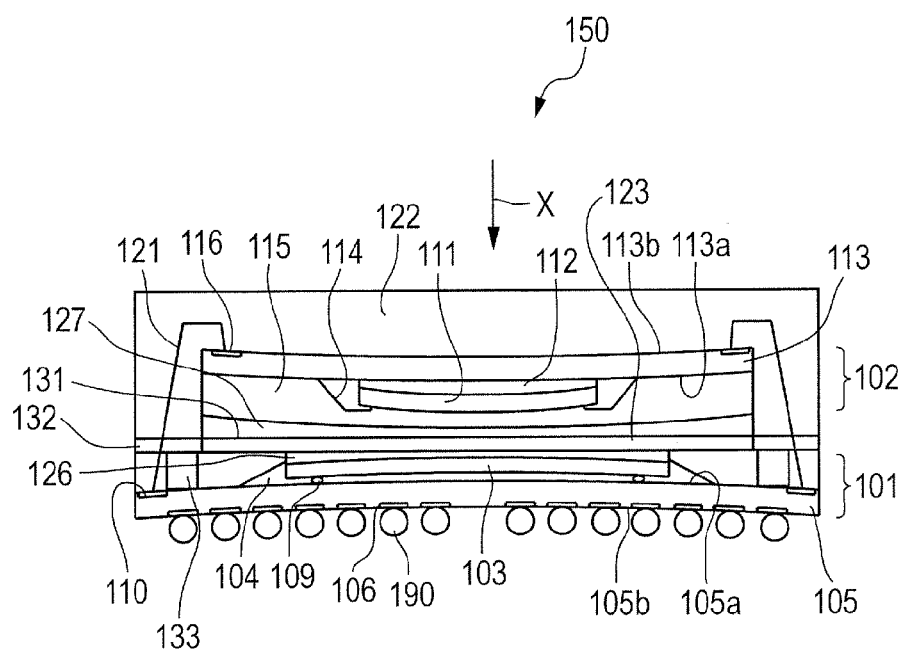
FIG. 2 is a cross-sectional view of the stacked semiconductor device along a line II-II illustrated in FIG. 1.

FIG. 1 is a plan view illustrating a schematic configuration of a printed circuit board including a stacked semiconductor device according to a first exemplary embodiment of the present invention. FIG. 2 is a cross-sectional view of the stacked semiconductor device along a line II-II illustrated in FIG. 1. In FIG. 1, illustration of an encapsulating resin for the stacked semiconductor device is omitted for convenience of illustration.

As illustrated in FIG. 1, a printed circuit board 100 includes a stacked semiconductor device 150 and a main substrate 180 serving as a printed wiring board. The stacked semiconductor device 150 is mounted on one of both surfaces of the main substrate 180. The stacked semiconductor device 150 is a package in package (PiP) type stacked semiconductor device.

As illustrated in FIG. 2, the stacked semiconductor device 150 includes a semiconductor package (a first semiconductor package) 101 and a semiconductor package (a second semiconductor package) 102 stacked on the semiconductor package 101.

The semiconductor package 101 includes a semiconductor chip 103 serving as a first semiconductor element and a wiring substrate 105 serving as a first wiring substrate. The wiring substrate 105 is an interposer formed in the shape of a flat plate having one surface (front surface) 105a and the other surface (rear surface) 105b opposite to the surface 105a and having a square shape in planar view (as viewed in a direction indicated by an arrow X perpendicular to the surface 105a). The semiconductor chip 103 is mounted on the surface 105a in the pair of surfaces 105a and 105b of the wiring substrate 105. A plurality of connecting conductor pads 106, to which solder balls 190 serving as external connecting terminals are connected, formed of conductors is formed on the surface 105b of the wiring substrate 105.

The semiconductor chip 103 is formed to have a smaller area than the area of the wiring substrate 105, as viewed in the direction indicated by the arrow X perpendicular to the surface 105a (or the surface 105b) of the wiring substrate 105. The semiconductor chip 103 is mounted face down on the surface 105a of the wiring substrate 105. In this case, the semiconductor chip 103 is electrically connected to the surface 105a of the wiring substrate 105 through a protruding electrode 109 of the semiconductor chip 103. In the case, the protruding electrode 109 between the semiconductor chip 103 and the wiring substrate 105 may be protected by (encapsulated with) an encapsulating resin 104.

If the semiconductor chip 103 is mounted face down on the wiring substrate 105, a solder bump, a copper (Cu) bump, and a gold (Au) bump can be used as the protruding electrode 109. A thermosetting resin containing silica can be used as the encapsulating resin 104 between the semiconductor chip 103 and the wiring substrate 105. The semiconductor package 101 has a shape in which edges (outer circumferential edges), particularly four corners 105c (FIG. 1), of the wiring substrate 105 are warped toward the surface 105b of the wiring substrate 105 at an ordinary temperature.

More specifically, in manufacturing processes, the semiconductor chip 103 and the wiring substrate 105 are bonded to each other by being heated to a first temperature (approximately 150 [° C.]) with the semiconductor chip 103 loaded on the wiring substrate 105. The wiring substrate 105 is composed of a glass epoxy resin (13 to 40 [ppm]) or a copper foil used for wiring (15 to 20 [ppm]) having a higher linear expansion coefficient than that of the semiconductor chip 103. When the semiconductor chip 103 and the wiring substrate 105 are cooled, therefore, the edges, particularly the corners 105c, of the wiring substrate 105 are warped toward the surface 105b of the wiring substrate 105 due to a difference between the linear expansion coefficients.

The semiconductor chip 103 in the semiconductor package 101 may be mounted face up on the surface 105a of the wiring substrate 105 and may be adhesively fixed to the surface 105a of the wiring substrate 105 with a bonding material sandwiched therebetween. In the case, the semiconductor chip 103 is electrically connected to the surface 105a of the wiring substrate 105 through a plurality of metal wirings. The package 101 includes the encapsulating resin 104 for encapsulating the semiconductor chip 103, the surface 105a of the wiring substrate 105, and the metal wirings. In the case, the metal wirings may include a gold wiring, a copper wiring, and a silver wiring.

The semiconductor package 102 is disposed on the side opposing the surface 105a of the wiring substrate 105 in the semiconductor package 101. The semiconductor package 102 includes a semiconductor chip 111 serving as a second semiconductor element and a wiring substrate 113 serving as a second wiring substrate. The wiring substrate 113 is an interposer formed in the shape of a flat plate having one surface 113a and the other surface 113b opposite to the surface 113a and having a square shape in planar view (as viewed in the direction indicated by the arrow X perpendicular to the surface 105a). The wiring substrate 113 is formed to have a smaller area than the area of the wiring substrate 105, as viewed in the direction indicated by the arrow X. The wiring substrate 113 is disposed within a region excluding edges (outer circumferential edges) of the surface 105a of the wiring substrate 105 not to protrude from the edges of the surface 105a of the wiring substrate 105, as viewed in the direction indicated by the arrow X.

The semiconductor chip 111 is mounted on the surface 113a in the pair of surfaces 113a and 113b of the wiring substrate 113. The semiconductor chip 111 is formed to have a smaller area than the area of the wiring substrate 113, as viewed in the direction indicated by the arrow X. The semiconductor chip 111 is mounted face up on the surface 113a of the wiring substrate 113, and is fixed (fixedly bonded) thereto with a bonding material (adhesive member) sandwiched therebetween. The semiconductor chip 111 and the surface 113a of the wiring substrate 113 are electrically connected to each other through metal wirings 114. The surface 113a of the wiring substrate 113, the semiconductor chip 111, and the metal wirings 114 are encapsulated with an encapsulating resin 115.

The semiconductor chip 111 may be mounted face down on the surface 113a of the wiring substrate 113. In this case, the semiconductor chip 111 may be electrically connected to the surface 113a of the wiring substrate 113 through a protruding electrode of the semiconductor chip 111.

In the first exemplary embodiment, the surface 105a of the wiring substrate 105 and the surface 113a of the wiring substrate 113 are disposed to oppose each other. A plurality of conductor pads (electrodes) 110 serving as first conductor pads is formed on the surface 105a of the wiring substrate 105. A plurality of conductor pads (electrodes) 116 serving as second conductor pads is formed on the surface 113b of the wiring substrate 113.

As illustrated in FIG. 1, the plurality of the conductor pads 110 are spaced apart from one another along the edges (outer circumferential edges) of the surface 105a of the wiring substrate 105. The plurality of conductor pads 116 are spaced apart from one another along edges (outer circumferential edges) of the surface 113a of the wiring substrate 113. That is, the conductor pads 110 are respectively disposed at positions not overlapping the wiring substrate 113, as viewed in the direction indicated by the arrow X. In other words, the wiring substrate 113 is disposed at a position not overlapping the conductor pads 110, as viewed in the direction indicated by the arrow X.

The stacked semiconductor device 150 includes a plurality of metal wirings 121 for electrically connecting the conductor pads 110 and the conductor pads 116 to each other and an encapsulating resin 122 for encapsulating at least the conductor pads 110 and 116 and the metal wirings 121.

A wiring of the wiring substrate 105 and a wiring of the wiring substrate 113 are connected to each other through the plurality of metal wirings 121. Thus, the wiring density of the wirings can be more improved than that when the wirings are connected to each other through solder balls.

Each of the metal wirings 114 and 121 in the first exemplary embodiment may include a gold wiring, a copper wiring, and a silver wiring.

The semiconductor chip 103 is, for example, a central processing unit (CPU), and the semiconductor chip 111 is, for example, a memory. The semiconductor chip 103 and the semiconductor chip 111 transmit and receive a signal to and from each other through the wiring substrates 105 and 113 and the metal wirings 121. The number of semiconductor chips 103 may be one or plural. The number of semiconductor chips 111 may be one or plural.

In the first exemplary embodiment, the surface 105a of the wiring substrate 105, the semiconductor chip 103, the metal wirings 121, and the semiconductor package 102 are encapsulated with the encapsulating resin 122 to resin-encapsulate the conductor pads 110 and 116 and the metal wirings 121. A resin material for the encapsulating resin 122 may be identical to or different from a resin material for the encapsulating resin 115.

The stacked semiconductor device 150 includes a plate member 123 interposed between the semiconductor package 101 and the semiconductor package 102. In the first exemplary embodiment, the plate member 123 is interposed between the semiconductor chip 103 and the encapsulating resin 115.

Figure 3A:
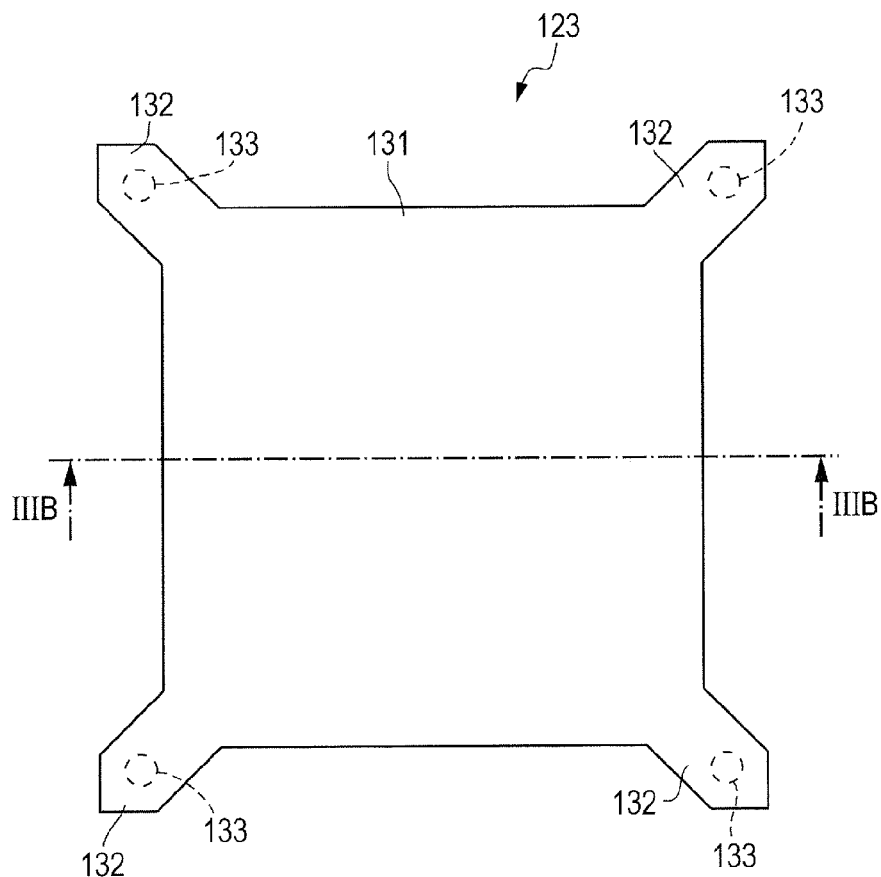
FIGS. 3A and 3B illustrate a plate member in the first exemplary embodiment.
Figure 3B:
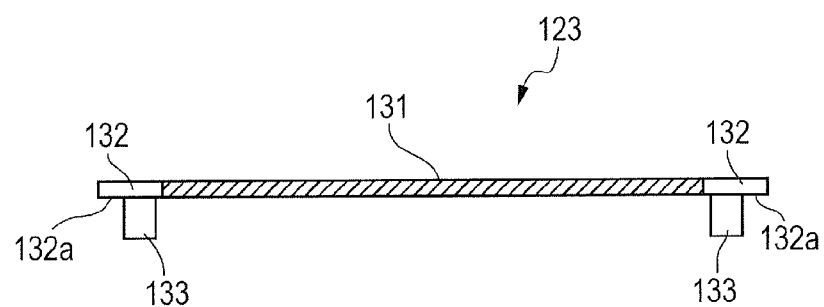

FIGS. 3A and 3B illustrate the plate member 123. FIG. 3A is a plan view of the plate member 123, and FIG. 3B is a cross-sectional view of the plate member 123 along a line IIIB-IIIB illustrated in FIG. 3A.

The plate member 123 has a plate body 131 having a substantially square shape formed to have a smaller area than that of the wiring substrate 105, as viewed in the direction indicated by the arrow X (FIG. 2), as illustrated in FIG. 3A. The semiconductor package 101 is fixedly bonded to one surface of the plate body 131 with a bonding material 126 such as an adhesive member sandwiched therebetween, and the semiconductor package 102 is fixedly bonded to the other surface thereof with a bonding material 127 such as an adhesive member sandwiched therebetween, as illustrated in FIG. 2. The plate body 131 may be of a size not interfering with the metal wirings 121 and such a size that the semiconductor packages 101 and 102 can be fixedly bonded thereto. That is, the plate body 131 has a smaller area than that of the wiring substrate 105 and is disposed within a region excluding the edges of the surface 105a of the wiring substrate 105, as viewed in the direction indicated by the arrow X perpendicular to the surface 105a of the wiring substrate 105.

The plate member 123 has a plurality of (three or more) protruding strips, four protruding strips 132 in the first exemplary embodiment, respectively protruding from the corners of the plate body 131 with the corners used as base ends. Further, the plate member 123 has leg portions 133 respectively disposed on surfaces 132a, on the side opposing the surface 105a of the wiring substrate 105, of the protruding strips 132. While the leg portions 133 are respectively formed integrally with the protruding strips 132 in the first exemplary embodiment, the leg portions 133 may be fixed to the protruding strips 132 with adhesive members.

Each of the protruding strips 132 is formed to extend toward the edge of the surface 105a of the wiring substrate 105 at a position not interfering with the metal wiring 121, i.e., the conductor pad 110, as viewed in the direction indicated by the arrow X. In the present exemplary embodiment, each of the protruding strips 132 is formed to protrude toward a position opposing the corner 105c among the edges of the surface 105a.

The leg portion 133 provided in each of the protruding strips 132 is formed in a convex shape protruding toward the surface 105a of the wiring substrate 105. An end surface (contact surface) of each of the leg portions 133 contacts the surface 105a of the wiring substrate 105. That is, the semiconductor package 101 (specifically, the semiconductor chip 103) is fixed to the plate body 131 with each of the leg portions 133 contacting the surface 105a of the wiring substrate 105. The leg portions 133 are set so that their respective heights in the direction indicated by the arrow X extending from the surface 132a are the same.

The surface 105a of the wiring substrate 105 and the leg portions 133 of the plate member 123 are made to directly contact each other so that the semiconductor package 101 is fixedly bonded to the plate body 131 of the plate member 123 with the leg portions 133 sandwiched therebetween without the wiring substrate 105 being inclined toward the plate body 131.

The wiring substrate 105 is directly supported by the leg portions 133. Thus, a mounting height of the wiring substrate 105 on the plate member 123 can be made constant at the height of the leg portions 133. Further, thermal deformation of the wiring substrate 105 in a resin encapsulating process can be suppressed because the wiring substrate 105 is supported by the leg portions 133. As described above, the leg portions 133 can suppress a variation in position of the surface 105b of the wiring substrate 105, and prevents a gap from occurring between a metal mold in the resin encapsulating process of the stacked semiconductor device 150 and the surface 105b of the wiring substrate 105. Therefore, a resin burr can be inhibited from being generated.

While each of the leg portions 133 is columnar in the first exemplary embodiment, the leg portion 133 may have any shape such as spherical, conical, polygonal columnar, or polygonal pyramidal shape if it can contact the wiring substrate 105 at its one or more points.

The leg portions 133 directed toward the surface 105a of the wiring substrate 105 may contact the surface 105a with a bonding material such as an adhesive member sandwiched therebetween. In this case, the leg portions 133 and the wiring substrate 105 are integrated with each other with the bonding material sandwiched therebetween. Thus, the thermal deformation of the wiring substrate 105 in the resin encapsulating process can be more effectively suppressed. This more effectively prevents a gap from occurring between the metal mold in the resin encapsulating process of the stacked semiconductor device 150 and the surface 105b of the wiring substrate 105. Therefore, a resin burr can be inhibited from being generated.

As materials in the first exemplary embodiment, a thermosetting resin sheet and a thermosetting resin containing silica can be respectively used as the bonding materials 112, 126, and 127 and the encapsulating resins 104, 115, and 122.

For the wiring substrate 105, a glass epoxy resin and a copper foil, for example, can be respectively used as its base material and wiring layer. A linear expansion coefficient and a Young's modulus of the wiring substrate 105 at that time are respectively approximately $1.4 \times 10^{-5}$ to $1.6 \times 10^{-5}$ [1/K] and approximately 40 [Gpa].

The plate member 123 can have a higher linear expansion coefficient and a higher Young's modulus than those of the wiring substrate 105 to stably support the wiring substrate 105 and suppress the thermal deformation of the wiring substrate 105. Materials composing the plate member 123 include a metal material such as a 42 alloy having a linear expansion coefficient of approximately $4 \times 10^{-6}$ [1/K] and having a Young's modulus of approximately 145 [Gpa] and a ceramic material having a linear expansion coefficient of approximately $1.0 \times 10^{-5}$ [1/K] and having a Young's modulus of approximately 80 [Gpa].

In the first exemplary embodiment, the protruding strips 132 are formed to respectively protrude toward positions of the four corners 105c of the wiring substrate 105 from the plate body 131, as viewed in the direction indicated by the arrow X. Since the wiring substrate 105 thus has a square shape, the plate member 123 may have the four protruding strips 132 to respectively correspond to the four corners 105c. The number of protruding strips 132 may be four or more, and is not limited to four. A region R between the two adjacent protruding strips 132 is a region for routing the metal wirings 121, as viewed in the direction indicated by the arrow X.

The protruding strips 132 are thus respectively provided to oppose the corners 105c so that the regions R for routing the metal wirings 121 can be ensured. Further, the leg portions 133 can be provided at positions closer to diagonal lines connecting the four corners 105c where the thermal deformation of the wiring substrate 105 is the largest in the resin encapsulating process. Such a disposition of the leg portions 133 more effectively prevents a gap from occurring between the metal mold in the resin encapsulating process of the stacked semiconductor device 150 and the surface 105b of the wiring substrate 105. Therefore, a resin burr can be effectively inhibited from being generated.

The leg portions 133 may be exposed from the encapsulating resin 122. In this case, the leg portions 133 can be disposed just above the four corners 105c where the thermal deformation of the wiring substrate 105 is the largest on the diagonal lines connecting the four corners 105c. Therefore, a resin burr can be more effectively inhibited from being generated.

In FIG. 1, a broken line 134 indicates a contour line of a warped shape of the wiring substrate 105 in the semiconductor package 101. The wiring substrate 105 in the semiconductor package 101 is concentrically warped around the center of the semiconductor chip 103. Thus, the leg portions 133 are desirably disposed concentrically with respect to the center of the surface 105a of the wiring substrate 105. If the leg portions 133 are thus disposed, the wiring substrate 105 can be more stably supported by the leg portions 133. Therefore, a resin burr can be more effectively inhibited from being generated.

The thermal deformation including the warping of the wiring substrate 105 is large at the edges of the wiring substrate 105. Therefore, the leg portions 133 can be respectively disposed at ends of the protruding strips 132.

The thermal deformation including the warping of the wiring substrate 105 is the largest on the diagonal lines connecting the four corners 105c of the wiring substrate 105. Thus, the leg portions 133 are desirably disposed on the diagonal lines connecting the four corners 105c of the surface 105a of the wiring substrate 105. If the leg portions 133 are disposed on the diagonal lines connecting the four corners 105c of the surface 105a of the wiring substrate 105, the wiring substrate 105 can be more stably supported by the leg portions 133. The thermal deformation of the wiring substrate 105 by heating in the resin encapsulating process can also be more effectively suppressed. This results in a more enhanced effect of inhibiting a resin burr from being generated.

The plate member 123 may further have a beam portion connecting the respective ends of the two adjacent protruding strips 132 while leaving the region for routing the metal wirings 121. Further, a leg portion directed toward the surface 105a of the wiring substrate 105 may be provided in a part or the whole of the beam portion. Such a configuration enables the leg portion to suppress the thermal deformation of the wiring substrate 105 by heating in the resin encapsulating process in a larger area. This can result in a more enhanced effect of inhibiting a resin burr from being generated.

A position where the wiring substrate 105 and each of the leg portions 133 contact each other is desirably outside a region where the connecting conductor pads 106 are disposed and in contact with the surface 105a of the wiring substrate 105, as viewed in the direction perpendicular to the surface 105b of the wiring substrate 105. If the leg portion 133 and the wiring substrate 105 thus contact each other, the thermal deformation of the wiring substrate 105 in the resin encapsulating process can be suppressed outside the region where the connecting conductor pads 106 are disposed. Therefore, a resin burr can be effectively inhibited from being generated in the connecting conductor pads 106 disposed on the surface 105b of the wiring substrate 105.

Figure 4A:
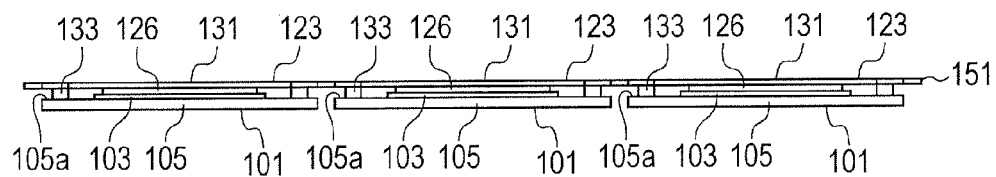
FIGS. 4A, 4B and 4C illustrate an example of a method for manufacturing the stacked semiconductor device according to the first exemplary embodiment.
Figure 4B:
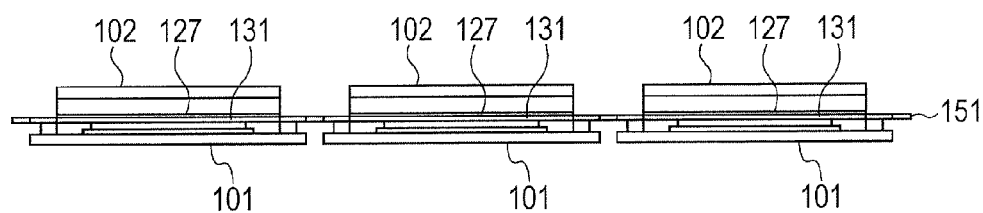
Figure 4C:
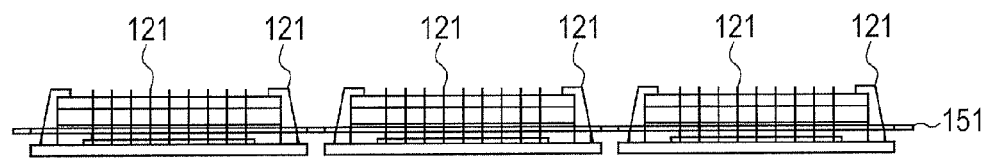
Figure 5A:
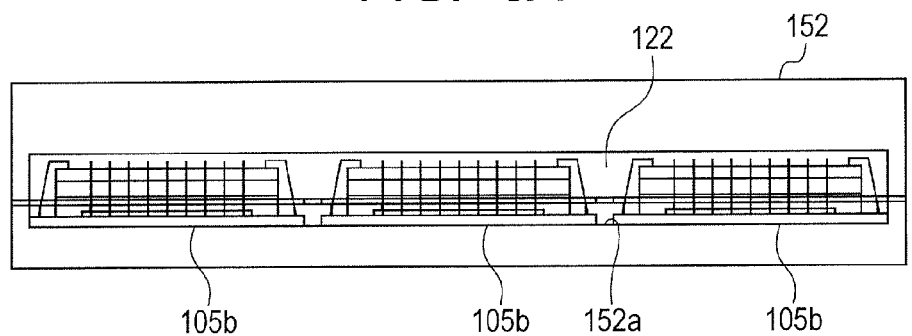
FIGS. 5A, 5B and 5C illustrate an example of a method for manufacturing the stacked semiconductor device according to the first exemplary embodiment.
Figure 5B:
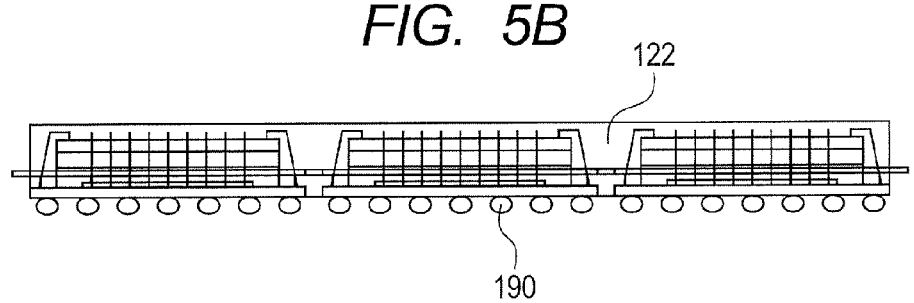
Figure 5C:
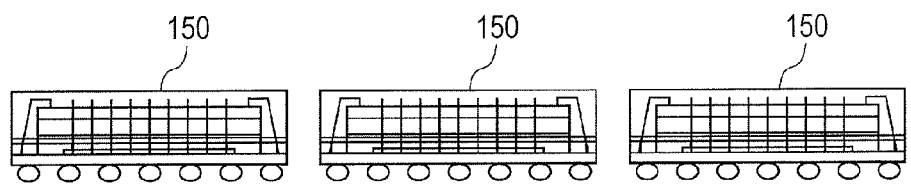

FIGS. 4A to 4C and 5A to 5C illustrate an example of a method for manufacturing the stacked semiconductor device 150 according to the first exemplary embodiment of the present invention. FIG. 4A illustrates a first fixedly bonding process in the processes for manufacturing the stacked semiconductor device 150. FIG. 4B illustrates a second fixedly bonding process in the processes for manufacturing the stacked semiconductor device 150. FIG. 4C illustrates a wire bonding process in the processes for manufacturing the stacked semiconductor device 150. FIG. 5A illustrates a resin encapsulating process in the processes for manufacturing the stacked semiconductor device 150. FIG. 5B illustrates a process for mounting solder balls 190 serving as connecting terminals in the processes for manufacturing the stacked semiconductor device 150. FIG. 5C illustrates a dividing process in the processes for manufacturing the stacked semiconductor device 150.

As illustrated in FIG. 4A, a sheet-shaped plate material 151 formed by connecting a plurality of plate members 123 is prepared, and semiconductor packages 101 are respectively fixedly bonded to lower surfaces of plate bodies 131 of the plate members 123 in the plate material 151 (a first fixedly bonding process).

More specifically, the plate members 123 are respectively bonded to semiconductor chips 103 in the semiconductor packages 101 using thermosetting resin sheets serving as bonding materials 126, to thermally cure the bonding materials 126. Each of the plate members 123 has a plate body 131, protruding strips 132, and leg portions 133, as illustrated in FIGS. 3A and 3B. Therefore, the plate body 131 of the plate member 123 is fixedly bonded to the semiconductor package 101 so that the leg portions 133 of the plate member 123 contact a surface 105a of a wiring substrate 105 in the semiconductor package 101. The plate body 131 is fixedly bonded to a position not protruding from the outer circumference of the wiring substrate 105, as viewed in a direction perpendicular to the surface 105a of the wiring substrate 105.

The plate body 131 is fixedly bonded onto the semiconductor chip 103 in the semiconductor package 101 so that the leg portions 133 provided on the protruding strips 132 and the wiring substrate 105 contact each other. Therefore, the semiconductor package 101 is fixedly bonded to the plate body 131 of the plate member 123 with the leg portions 133 sandwiched therebetween without the wiring substrate 105 being inclined toward the plate body 131.

The wiring substrate 105 is directly supported by the leg portions 133 of the plate member 123. Thus, a mounting height of the wiring substrate 105 on the plate body 131 can be made constant at the height of the leg portions 133. At this time, the height of the leg portions 133 is desirably larger than the sum of a warping amount of the wiring substrate 105 and a mounting height of the semiconductor chip 103 on the wiring substrate 105. If the height of the leg portions 133 is thus set, the leg portions 133 and the wiring substrate 105 can be more reliably made to contact each other.

As illustrated in FIG. 4B, the semiconductor packages 102 are then respectively supplied onto the plate bodies 131 of the plate members 123, and the semiconductor packages 102 are respectively fixedly bonded to the plate bodies 131 of the plate members 123 (a second fixedly bonding process).

More specifically, each of the semiconductor packages 102 is bonded onto the plate body 131 of the plate member 123 using a thermosetting resin sheet serving as a bonding material 127, to thermally cure the bonding material 127. In the case, the wiring substrate 113 is fixedly bonded onto a position not protruding from the outer circumference of the wiring substrate 105, i.e., the plate body 131, as viewed in the direction perpendicular to the surface 105a of the wiring substrate 105. Thus, the plate body 131 is sandwiched between the semiconductor packages 101 and 102.

As illustrated in FIG. 4C, conductor pads 110 in the wiring substrate 105 and conductor pads 116 in the wiring substrate 113 are respectively electrically connected to each other by wire bonding through metal wirings 121 (a wire bonding process). The wiring substrate 113 has a smaller area than that of the wiring substrate 105 and is disposed within a region of the wiring substrate 105, not to protrude from the outer circumference of the wiring substrate 105, as viewed in the direction perpendicular to the surface 105a of the wiring substrate 105. The plate body 131 has an area that is not more than the area of the wiring substrate 113 and is disposed within a region of the wiring substrate 113, not to protrude from the outer circumference of the wiring substrate 113, as viewed in the direction perpendicular to the surface 105a of the wiring substrate 105. Therefore, the plate body 131 does not interfere with the metal wirings 121 during work of the wire bonding so that the workability of the wire bonding is good.

After the wire bonding process, a unit including the semiconductor packages 101 and 102 and the plate member 123 is then disposed in a chamber within a metal mold 152, as illustrated in FIG. 5A. At this time, the unit is disposed so that a surface 105b of the wiring substrate 105 in the semiconductor package 101 becomes a lower surface. That is, the surface 105b of the wiring substrate 105 contacts a surface 152a of the metal mold 152. The wiring substrate 105 is disposed within the metal mold 152 with there being no gap between the surface 105b and the surface 152a of the metal mold 152, although its edges (particularly its corners) are warped toward the surface 105a.

A melted melting resin is supplied to the metal mold 152 and solidified, to collectively encapsulate the plate member 123, together with the semiconductor package 101, the metal wirings 121, and the semiconductor package 102, with the encapsulating resin 122 (a resin encapsulating process). That is, the sheet-shaped plate material 151, together with the plurality of semiconductor packages 101 and the plurality of semiconductor packages 102, is collectively encapsulated with the encapsulating resin 122. More specifically, the surface 105a of the wiring substrate 105, the semiconductor chip 103, the metal wirings 121, the semiconductor package 102, and the plate member 123 are collectively encapsulated with the encapsulating resin 122. In the case, the resin encapsulation is performed by transfer molding using a thermosetting resin containing silica as the encapsulating resin 122, to thermally cure the encapsulating resin 122. At this time, a mounting height of the wiring substrate 105 on the plate body 131 is made constant while inclination of the wiring substrate 105 is suppressed by contact of the leg portions 133 with the wiring substrate 105. Therefore, a gap is inhibited from occurring between the surface 152a of the metal mold 152 and the surface 105b of the wiring substrate 105.

The wiring substrate 105 is heated to a second temperature (180 [° C.]) higher than a first temperature (150 [° C.]). Thus, a force is generated in a direction in which its edges (particularly its corners) are warped toward the surface 105a. However, the wiring substrate 105 is supported by the surface 152a of the metal mold 152 and the leg portions 133. Thus, the thermal deformation by heating during the resin encapsulation is suppressed. This inhibits a gap from occurring between the surface 152a of the metal mold 152 and the surface 105b of the wiring substrate 105. Since the gap is thus inhibited from occurring between the surface 152a of the metal mold 152 and the surface 105b of the wiring substrate 105, a resin burr can be prevented from being generated on the surface 105b of the wiring substrate 105. Thus, defective bonding of the solder balls 190 in connecting conductor pads 106 is reduced, resulting in an improved yield of the stacked semiconductor device 150. The use of the sheet-shaped plate material 151 enables a plurality of semiconductor packages to be collectively encapsulated while inhibiting a resin burr from being generated in the plurality of semiconductor packages, resulting in high productivity.

A film member having elasticity may be provided between the surface 152a of the metal mold 152 and the surface 105b of the wiring substrate 105 when the resin encapsulation is performed. In the case, the height of the leg portions 133 is desirably set so that a gap between the surface 152a of the metal mold 152 and the surface 105b of the wiring substrate 105 is thinner than the film member. Thus, the surface 105b of the wiring substrate 105 sinks into the film member when the resin encapsulation is performed. This more reliably inhibits a gap from occurring between the film member and the surface 105b of the wiring substrate 105. Therefore, a resin burr can be reliably inhibited from being generated on the surface 105b of the wiring substrate 105.

As illustrated in FIG. 5B, the solder balls 190 serving as external connecting terminals are respectively positioned in the connecting conductor pads 106 in the wiring substrate 105, and are connected thereto by reflowing (a connecting terminal forming process). As illustrated in FIG. 5C, both the encapsulating resin 122 and the sheet-shaped plate material 151 are cut by dicing and are divided into individual stacked semiconductor devices 150 (a dividing process).

In such a manufacturing method, semiconductor packages in a divided state can be used as both the semiconductor packages 101 and 102. Thus, a performance test is easy to implement. A screening test such as a burn-in test can also be implemented. Therefore, semiconductor packages, which have previously been guaranteed to be nondefective, can be used as the semiconductor packages 101 and 102 used to manufacture the stacked semiconductor device 150. A resin burr can be inhibited from being generated on the surface 105*b* of the wiring substrate 105. Thus, the stacked semiconductor device 150 can be manufactured with a higher yield.

As described above, the yield of the PiP type stacked semiconductor device 150 can be improved by inhibiting a resin burr generated when the divided semiconductor packages 101 and the divided semiconductor packages 102 are respectively stacked on the plate members 123 in the sheet-shaped plate material 151 to manufacture the stacked semiconductor device 150.

(Second Exemplary Embodiment)

Figure 6:
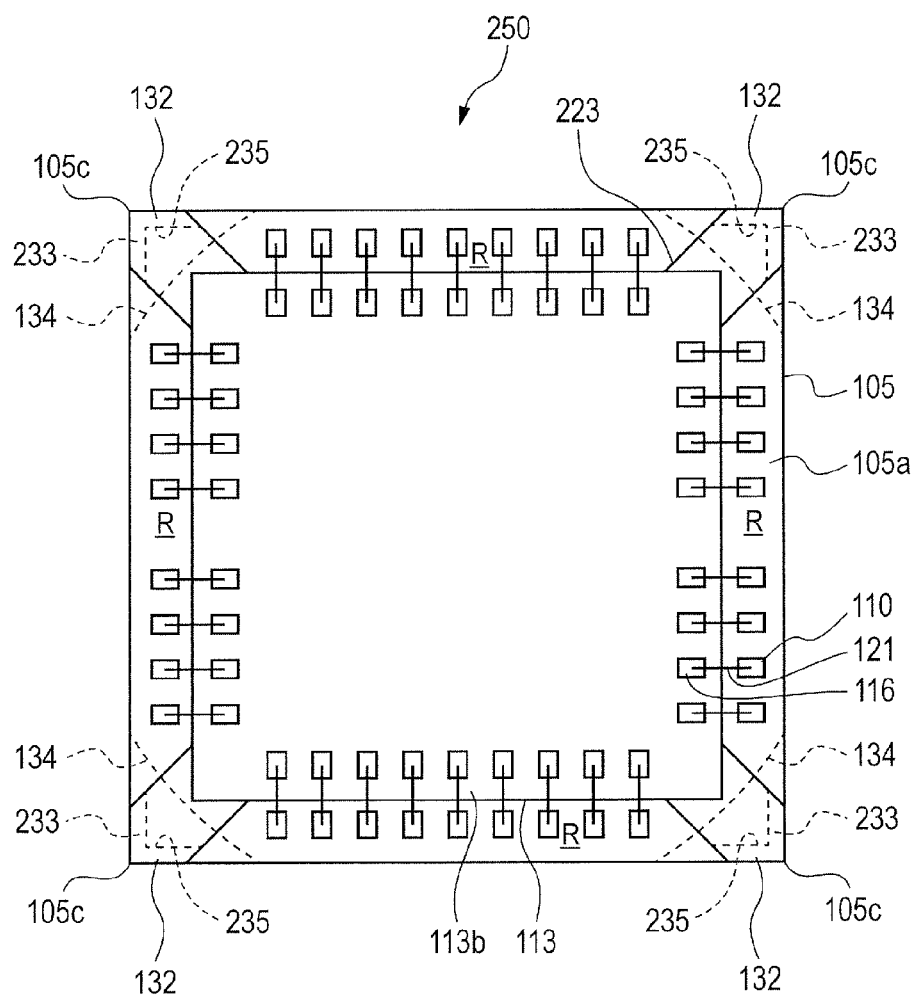
FIG. 6 is a plan view illustrating a schematic configuration of a stacked semiconductor device according to a second exemplary embodiment.

A stacked semiconductor device according to a second exemplary embodiment of the present invention will be described below. FIG. 6 is a plan view illustrating a schematic configuration of the stacked semiconductor device according to the second exemplary embodiment of the present invention. In the stacked semiconductor device according to the second exemplary embodiment illustrated in FIG. 6, similar components to those of the stacked semiconductor device according to the first exemplary embodiment are assigned the same reference numerals, and hence description thereof is not repeated.

A stacked semiconductor device 250 according to the second exemplary embodiment includes a plate member 223 having a shape different from that of the plate member 123 in the first exemplary embodiment.

The plate member 223 has a plate body 131 and four protruding strips 132 respectively protruding from corners of the plate body 131, like in the first exemplary embodiment.

The plate member 223 has convex leg portions 233 provided on surfaces, which oppose a surface 105*a* of a wiring substrate 105, of the protruding strips 132. Each of the leg portions 233 has an end surface contacting the surface 105*a* of the wiring substrate 105, and a shape of the end surface has a notch (recess) 235 formed in its portion corresponding to the inside of the wiring substrate 105. The notch 235 is formed to be recessed toward the outside of the wiring substrate 105.

A semiconductor package 101 has a shape in which edges, particularly corners 105*c*, of the wiring substrate 105 are warped toward a surface 105*b* of the wiring substrate 105. If the shape of the leg portion 233 is spherical, columnar, conical, polygonal columnar, or polygonal pyramidal, the leg portion 233 contacts the wiring substrate 105 at its one point.

According to the second exemplary embodiment, the notch 235 in the shape of the end surface of the leg portion 233 enables the leg portion 233 to contact the wiring substrate 105 at its two points to correspond to a warped shape of the wiring substrate 105. If the number of contact points between the leg portion 233 and the wiring substrate 105 increases, the wiring substrate 105 can be more stably supported by the leg portions 233. Therefore, a resin burr can be more effectively inhibited from being generated in the stacked semiconductor device 250.

(Third Exemplary Embodiment)

Figure 7:
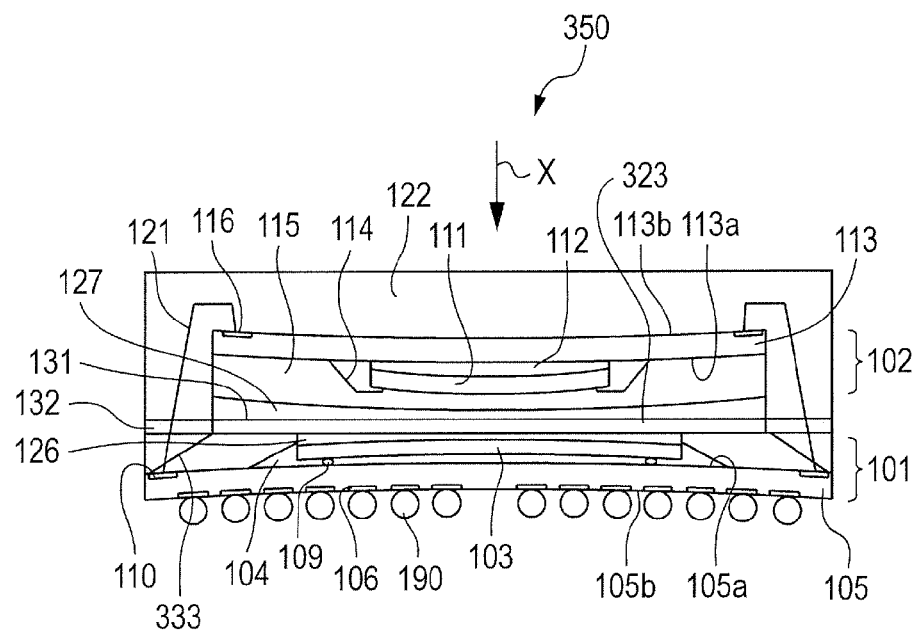
FIG. 7 is a cross-sectional view illustrating a schematic configuration of a stacked semiconductor device according to a third exemplary embodiment.

A stacked semiconductor device according to a third exemplary embodiment of the present invention will be described below. FIG. 7 is a cross-sectional view illustrating a schematic configuration of the stacked semiconductor device according to the third exemplary embodiment of the present invention. In the stacked semiconductor device according to the third exemplary embodiment illustrated in FIG. 7, similar components to those of the stacked semiconductor device according to the first exemplary embodiment are assigned the same reference numerals, and hence description thereof is not repeated.

A stacked semiconductor device 350 according to the third exemplary embodiment includes a plate member 323 having a shape different from those of the plate members 123 and 223 in the first and second exemplary embodiments.

The plate member 323 has a plate body 131 and four protruding strips 132 respectively protruding from corners of the plate body 131, like in the first exemplary embodiment.

The plate member 323 has convex leg portions 333 provided on surfaces, which oppose a surface 105*a* of a wiring substrate 105, of the protruding strips 132.

Each of the leg portions 333 is formed in a shape tapered toward an edge (specifically, a corner) of the surface 105*a* of the wiring substrate 105.

In the third exemplary embodiment, a cross-sectional shape of each of the leg portions 333 has an inclined surface directed toward an upper end of the wiring substrate 105, as viewed in a direction horizontal to the surface 105*a* of the wiring substrate 105. The leg portion 333 and the corner of the surface 105*a* of the wiring substrate 105 contact each other.

At the edge, particularly the corner, of the surface 105*a* of the wiring substrate 105 in the semiconductor package 101, thermal deformation by heating in a resin encapsulating process increases. When the corner of the surface 105*a* of the wiring substrate 105 is supported by the leg portion 333, an effect of suppressing the thermal deformation by heating in the resin encapsulating process is high. Therefore, a resin burr can be more effectively inhibited from being generated in the stacked semiconductor device 350.

(Fourth Exemplary Embodiment)

Figure 8:
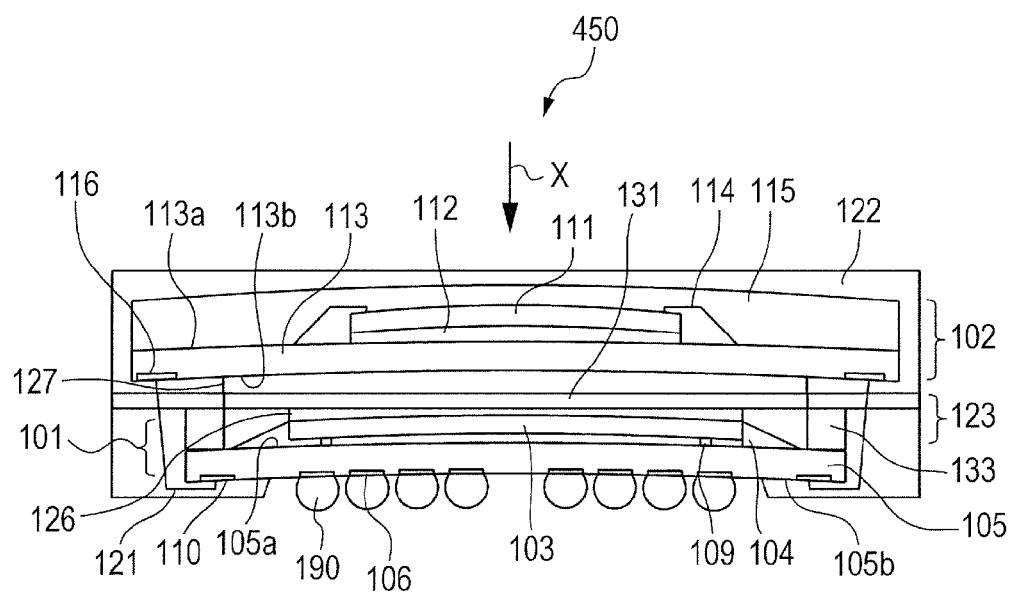
FIG. 8 is a cross-sectional view illustrating a schematic configuration of a stacked semiconductor device according to a fourth exemplary embodiment.

A stacked semiconductor device according to a fourth exemplary embodiment of the present invention will be described below. FIG. 8 is a cross-sectional view illustrating a schematic configuration of the stacked semiconductor device according to the fourth exemplary embodiment of the present invention.

While a case where the wiring substrate 105 is larger than the wiring substrate 113 has been described in the first to third exemplary embodiments, the present invention is also applicable to a case where the wiring substrate 113 is larger than the wiring substrate 105. In this case, as illustrated in FIG. 8, a wiring substrate 113 and a wiring substrate 105 are disposed so that a surface 113*b* of the wiring substrate 113 and a surface 105*a* of the wiring substrate 105 oppose each other. Further, a plurality of conductor pads 116 provided on the surface 113*b* of the wiring substrate 113 and a plurality of conductor pads 110 provided on a surface 105*b* of the wiring substrate 105 are connected to each other through metal wirings 121. Respective parts of the surface 105*a* and the surface 105*b* of the wiring substrate 105, a semiconductor chip 103, the metal wirings 121, and a semiconductor package 102 are encapsulated with an encapsulating resin 122.

In this case, the surface 105*a* of the wiring substrate 105 and leg portions 133 of a plate member 123 are also made to directly contact each other so that a semiconductor package 101 is fixedly bonded to a plate body 131 of the plate member 123 with the leg portions 133 sandwiched therebetween without the wiring substrate 105 being inclined toward the plate body 131.

The wiring substrate 105 is directly supported by the leg portions 133. Thus, a mounting height of the wiring substrate 105 on the plate member 123 can be made constant at the height of the leg portions 133. Further, thermal deformation of the wiring substrate 105 in a resin encapsulating process can be suppressed because the wiring substrate 105 is directly supported by the leg portions 133. As described above, the leg portions 133 can suppress a variation in position of the surface 105b of the wiring substrate 105. This can prevent a gap from occurring between a metal mold in the resin encapsulating process of a stacked semiconductor device 450 and the surface 105b of the wiring substrate 105. Therefore, a resin burr can be inhibited from being generated in conductor pads 106.

The present invention is not limited to the above-mentioned exemplary embodiments. Many modifications are possible by a person having normal knowledge in the field within a technical thought of the present invention.

While a case where one second semiconductor package is stacked on a first semiconductor package has been described in the first to fourth exemplary embodiments, the present invention is also applicable to a case where one or a plurality of semiconductor packages is stacked on a second semiconductor package.

While a case where the conductor pads 110 are formed on the surface 105a has been described in the first to fourth exemplary embodiments, the present invention is also applicable to a case where the conductor pads 110 are formed on the surface 105b.

While a case where the conductor pads 116 are formed on the surface 113b has been described in the first to fourth exemplary embodiments, the present invention is also applicable to a case where the conductor pads 116 are formed on the surface 113a.

While a case where the semiconductor chip 111 is mounted on the surface 113a has been described in the first to fourth exemplary embodiments, the present invention is also applicable to a case where the semiconductor chip 111 is mounted on the surface 113b.

While a case where each of the wiring substrates 105 and 113 has a substantially square shape, as viewed in the direction perpendicular to the surface of the wiring substrate has been described in the first to fourth exemplary embodiments, the present invention is not limited to this. The present invention is also applicable to a case where the wiring substrate has any shape such as a polygonal, circular, or trapezoidal shape.

According to the present invention, the leg portions of the plate member are made to contact the first wiring substrate in the first semiconductor package, to support the first wiring substrate. This can suppress a variation in a loading position of the first semiconductor package on the plate body of the plate member due to warping of the first wiring substrate toward its one surface on which the first semiconductor element has been mounted and loading inclination of the first semiconductor package. Therefore, a resin burr is inhibited from being generated on the other surface of the first wiring substrate. Thus, defective connection of the connecting terminals in the connecting conductor pads is reduced, resulting in an improved yield of the stacked semiconductor device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-137014, filed Jun. 28, 2013 which is hereby incorporated by reference herein in its entirety.

What is claimed is:

1. A stacked semiconductor device comprising:
a first semiconductor package having
a first semiconductor element, and
a first wiring substrate having a pair of surfaces, on one of which the first semiconductor element is mounted, and on the other of which a plurality of connecting conductor pads each connected to a connecting terminal are formed, wherein a plurality of first conductor pads are formed on one or the other surface of the wiring substrate;
a second semiconductor package being disposed at a side in opposition to the one surface of the first wiring substrate of the first semiconductor package, and having
a second semiconductor element, and
a second wiring substrate having a pair of surfaces, on one of which the second semiconductor element is mounted, wherein a plurality of second conductor pads are formed on one or the other surface of the second wiring substrate;
a plate member having
a plate body arranged between the first and second semiconductor packages, and fixed to the first and second semiconductor packages, and
a plurality of protruding strips protruding from a base end at the plate body to a position in opposition to an edge of the first wiring substrate;
a plurality of metal wirings each for connecting electrically each of the first conductor pads to each of the second conductor pads; and
an encapsulating resin for encapsulating at least the plurality of first conductor pads, the plurality of second conductor pads and the plurality of metal wirings,
wherein the plate member has a plurality of leg portions contacting the one surface of the first wiring substrate.

2. The stacked semiconductor device according to claim 1, wherein the second wiring substrate and the plate body have areas smaller than an area of the first wiring substrate and are arranged within a region surround by the edge of the first wiring substrate, viewing in a direction perpendicular to the surface of the first wiring substrate.

3. The stacked semiconductor device according to claim 1, wherein each of the leg portions is disposed at an end of the protruding strips in opposition to the one surface of the first wiring substrate.

4. The stacked semiconductor device according to claim 3, wherein each of the protruding strips protrudes to a position in opposition to a corner of the first wiring substrate.

5. The stacked semiconductor device according to claim 4, wherein each of the leg portions has an end surface contacting the one surface of the first wiring substrate, and the figure of the end surface has a notch formed at a portion thereof corresponding to an inside of the first wiring substrate.

6. The stacked semiconductor device according to claim 1, wherein each of the leg portions is tapered decreasingly toward an end of the one surface of the first wiring substrate.

7. A printed circuit board comprising:
a printed wiring board; and
the stacked semiconductor device according to claim 1 mounted on the printed wiring board.

8. A manufacturing method of a stacked semiconductor device, wherein the stacked semiconductor device comprises: a first semiconductor package that has a first semiconductor element and a first wiring substrate having a pair of surfaces, on one of which the first semiconductor element is mounted, and the other of which a plurality of connecting conductor pads each connected to a connecting terminal are mounted, wherein a plurality of first conductor pads are formed on one or the other surface of the wiring substrate; a second semiconductor package being disposed at a side in opposition to the one surface of the first wiring substrate of the first semiconductor package, and having a second semiconductor element and a second wiring substrate having a pair of surfaces, on one of which the second semiconductor element is mounted, wherein a plurality of second conductor pads are formed on one or the other surface of the wiring substrate, wherein the method comprises:

- preparing a plate member having a plate body, a plurality of protruding strips protruding from the plate body and a plurality of leg portions disposed at each of protruding strip;
- a first fixing step of fixing the plate body to the first semiconductor package, such that each of leg portions of the plate member contacts the one surface of the first wiring substrate of the first semiconductor package;
- a second fixing step of fixing the second semiconductor package to the plate body of the plate member, to sandwich the plate member between the first and second semiconductor packages;
- a wire bonding step of connecting electrically each of the first and second conductor pads through a metal wiring; and
- supplying a melting resin to the first and second conductor pads and the each of the metal wirings, to solidify the melting resin, and to encapsulate the first and second conductor pads and each of the metal wirings.

* * * * *